United States Patent [19]
Sempel et al.

[11] Patent Number: 5,619,538
[45] Date of Patent: Apr. 8, 1997

[54] PULSE SHAPING FM DEMODULAR WITH LOW NOISE WHERE CAPACITOR CHARGE STARTS ON INPUT SIGNAL EDGE

[75] Inventors: Adrianus Sempel; Johannes Van Nieuwenburg, both of Eindhoven, Netherlands

[73] Assignee: U.S. Philips Corporation, New York, N.Y.

[21] Appl. No.: 410,022

[22] Filed: Mar. 24, 1995

[30] Foreign Application Priority Data

Apr. 12, 1994 [EP] European Pat. Off. ............ 94200986

[51] Int. Cl.$^6$ .................................................... H03D 3/18
[52] U.S. Cl. ........................ 375/328; 327/102; 329/318; 329/342; 375/346
[58] Field of Search ................................. 375/284, 285, 375/340, 278, 346, 348, 351, 377, 254, 328; 329/305, 310, 342, 315, 318, 321, 341, 343, 344; 361/15, 18; 327/39, 43, 42, 102, 166, 176; 455/214, 337

[56] References Cited

U.S. PATENT DOCUMENTS

| | | | |
|---|---|---|---|
| 2,956,227 | 9/1960 | Pierson | 324/76.67 |
| 4,282,490 | 8/1981 | Kusakabe | 329/342 |
| 5,017,841 | 5/1991 | Miura | 329/325 |
| 5,039,956 | 8/1991 | Somer | 331/36 C |
| 5,126,846 | 6/1992 | Nimura | 348/613 |
| 5,315,651 | 5/1994 | Rahamim et al. | 379/412 |

OTHER PUBLICATIONS

Funkschau No. 15 of 1970, pp., 500–502.

*Primary Examiner*—Wellington Chin
*Assistant Examiner*—William Luther
*Attorney, Agent, or Firm*—Edward W. Goodman

[57] ABSTRACT

A receiver having, arranged in this order, an input section, an FM demodulator, to which a frequency-modulated input signal is applied, and an LF section, which FM demodulator includes a pulse shaper and a low-pass filter, the pulse shaper comprising a series arrangement of at least a load and a capacitance, the base-emitter junction of a transistor being arranged across the capacitance, and further including a switching device for charging and discharging the capacitance. The pulse shaper generates a low-noise pulse in that charging of a capacitance is started upon an edge of the input signal. The capacitance voltage is measured by a single transistor and when the transistor is turned on, the charging current of the capacitance is diverted via the transistor, so that the capacitance voltage is limited. The capacitance is discharged upon a second edge, after which the cycle is repeated. The output signal of the pulse shaper is a signal which varies with the current through the capacitance.

10 Claims, 3 Drawing Sheets

PULSE SHAPING FM DEMODULAR WITH LOW NOISE WHERE CAPACITOR CHARGE STARTS ON INPUT SIGNAL EDGE

BACKGROUND OF THE INVENTION

1. Field of the Invention

The invention relates to a receiver comprising, arranged in this order, an input section, an FM demodulator, to which a frequency-modulated input signal is applied, and an LF section, which FM demodulator comprises a pulse shaper and a low-pass filter. The invention also relates to such an FM demodulator.

Such a receiver is generally applicable for the reception of radio broadcast signals and/or television broadcast signals, in which the sound is transmitted as a frequency modulation of a carrier wave. Such an FM demodulator is suitable for general use, inter alia in the receiver defined above.

2. Description of the Related Art

Funkschau no. 15 of 1970, pp. 500–502, describes an FM demodulator for use in a receiver, which FM demodulator comprises a pulse shaper and a low-pass filter. The pulse shaper is used for generating a pulse of constant shape and width on at least one of the edges of the frequency modulated signal (in the prior-art FM demodulator). This yields a pulse train in which the time between two successive pulses varies with the modulation. The modulation signal is obtained by filtering this pulse train with a low-pass filter. Such a pulse count FM demodulator is substantially linear over a wide frequency range so that when it is used in a receiver, the distortion as a result of demodulation is very low in comparison with that in receivers comprising an FM demodulator of another type. This linearity over a wide frequency range renders this pulse count FM demodulator suitable for use in inter alia a multi-standard television receiver for demodulating the frequency-modulated sound whose carrier frequency may have a large range of values depending on the system standard.

A drawback of a receiver comprising such a pulse count FM demodulator is that the FM component in the output voltage of the FM demodulator is limited by the carrier frequency of the frequency-modulated signal. In radios, for example, the maximum swing is limited to 75 kHz at a carrier frequency which is converted to 10.7 MHz, which means that the modulation component in the output voltage is less than 0.75%. As a result, the demodulator is more sensitive to noise, leading to a deterioration of the signal-noise ratio in the receiver. One possible solution is to reduce the intermediate frequency of the receiver, which improves the ratio between the swing and the intermediate frequency. This requires, for example, additional components such as a mixer and a filter. Another possibility of reducing the influence of noise is to increase the pulse amplitude. However, in the case of implementation in an integrated circuit, the pulse amplitude cannot be increased to a unlimited extent because of the low supply voltage normally used in integrated circuits.

SUMMARY OF THE INVENTION

It is an object of the invention to mitigate these problems in a simple manner by providing a receiver with a simple integrable pulse count FM demodulator, which produces a significantly lower noise level on the output than attainable with the known pulse count FM demodulator, while maintaining an acceptable linearity within a frequency range of comparable size.

According to the invention a receiver of the type defined in the opening sentence is characterized in that:

the pulse shaper comprises:

a series arrangement of at least a load and a capacitance, which load is coupled to a first supply terminal, a switching device which charges the capacitance in a first state, initiated by a first edge of the frequency-modulated input signal, and which discharges the capacitance in a second state, initiated by a second edge following the first edge, a first transistor having its base-emitter junction arranged across the capacitance and having its collector coupled to the first or a second supply terminal, output means for generating an output signal which varies with the current through the capacitance, the charging time and the discharging time of the capacitance are smaller than the minimum time between two successive edges of the frequency-modulated input signal.

The invention is based on the recognition of the fact that the voltage across a capacitance can be measured with minimal noise by arranging a base-emitter junction of a single transistor directly across the capacitance, which transistor is turned on as soon as the voltage exceeds a limit value.

When this step is applied, the charging time of a capacitance can be limited accurately by means of a constant charging characteristic by interrupting the charging current of the capacitance at the instant at which the transistor is turned on, by diverting this current via the collector-emitter path of the transistor. This provides a pulse of accurately defined pulse width and a low noise level. Such a pulse can be used advantageously in a pulse count FM demodulator, which enables a receiver to be realized which has an improved signal-noise ratio in comparison with a receiver comprising said known FM demodulator.

A preferred embodiment of such a receiver is characterized in that:

the capacitance has a first and a second terminal coupled to the first supply terminal via the first and a second load, respectively, a second transistor has its base-emitter junction arranged across the capacitance in a direction opposite to that of the first transistor, the collectors of the first and the second transistors are jointly coupled to the first supply terminal, the switching device connects the first terminal or the second terminal of the capacitance to the second supply terminal in the first state and the second state, respectively, the output means generates an output signal which varies with the current through at least one of the first and second transistors and first and second loads. This yields a symmetrical pulse shaper whose output pulse width is insusceptible to residual charges in the capacitor. Since two transistors have been arranged across the capacitance, the current through at least one of the two transistors can be used to control the output means. In addition, the symmetrical construction enables an improved efficiency to be obtained because now a pulse is generated on both the rising edge and the falling edge in each period of the input signal.

A simple yet practical embodiment of such a receiver is characterized in that the switching device comprises a first differential amplifier with third and fourth emitter-coupled transistors, having the common emitter line coupled to the second supply terminal, the collectors of the third and the fourth transistors being coupled to, respectively, the second and the first terminals of the capacitance, the inputs coupled to the frequency-modulated symmetrical input signal.

A further embodiment is characterized in that the first and the second loads comprise the collector-emitter paths of a fifth and a sixth transistor, respectively, which fifth and sixth transistors have their collectors coupled to the first supply terminal via a first resistor. Third, fourth, fifth and sixth transistors form a bridge arrangement by means of which the current through the capacitance can be switched over. Owing to this arrangement, only a single resistor, instead of the two load, is connected to the capacitance in each state of the switching device, which reduces the noise in the capacitance voltage and the influence of noise on the output pulse width. This yields an improved signal-noise ratio in the receiver. The voltage across the first resistor can be used as an output voltage of the pulse shaper, which enables a simple implementation of the output means.

A further embodiment of the receiver, which renders the charging and the discharging time independent of the supply voltage, is characterized in that a current source is arranged in the connection of the switching device with the second supply terminal. The inclusion of a reference current source defines the charging and the discharging current independently of the supply voltage, so that noise on the supply voltage will not affect the charging and the discharging time.

Another simple embodiment of a receiver is characterized in that:

the capacitance has a first and a second terminal coupled to the first supply terminal via the first and a second load, respectively, a second transistor has its base-emitter junction arranged across the capacitance in a direction opposite to that of the first transistor, the collectors of the first and the second transistor are jointly coupled to the second supply terminal, the switching device couples the first terminal or the second terminal of the capacitance to the second supply terminal in the first state and the second state, respectively, the output means generate a signal which varies with the current through at least one of the first and second transistors.

A practical embodiment of such a receiver is characterized in that the switching device comprises a fifth and a sixth transistor, which fifth and sixth transistors have their collectors coupled to the second supply terminals and their emitters to, respectively, the first and the second terminal of the capacitance.

An embodiment which radiates less interference is characterized in that the pulse shaper comprises a voltage-transient compensation circuit whose output voltage is added to the switching voltages on the bases of fifth and sixth transistors, with which a first voltage difference is imposed between the base of the fifth transistor immediately before and the base of the sixth transistor immediately after the transition from the first to the second state, a second voltage difference is imposed between the base of the fifth transistor immediately after and the base of the sixth transistor immediately before the transition from the second to the first state, the first and the second voltage differences substantially corresponding to the capacitance voltage appearing during the first and the second switching operation. This step eliminates common-mode voltage transients across the capacitance. These voltage transients occur during switching and may adversely affect other circuits by coupling via parasitic capacitances.

An advantageous embodiment of an FM demodulator in accordance with the invention, comprising a pulse shaper, is characterized in that it is implemented as an integrated circuit in a semiconductor material and comprises:

a series arrangement of at least a load and a capacitance, which load is coupled to a first supply terminal, a switching device which charges the capacitance in a first state, initiated by a first edge of the frequency-modulated input signal, and which discharges the capacitance in a second state, initiated by a second edge following the first edge, a first transistor having its base-emitter junction arranged across the capacitance and having its collector coupled to the first or a second supply terminal, output means for supplying an output signal, which output signal varies with the current through the capacitance, to an output terminal intended to have a low-pass filter coupled thereto, the charging time and the discharging time of the capacitance being smaller than the minimum time between two successive edges of the frequency-modulated input signal.

BRIEF DESCRIPTION OF THE DRAWINGS

The invention will now be described in more detail with reference to the Figures shown in the drawings, in which corresponding elements bear the same references. In the drawings.

DESCRIPTION OF THE PREFERRED EMBODIMENT

Figure 1:
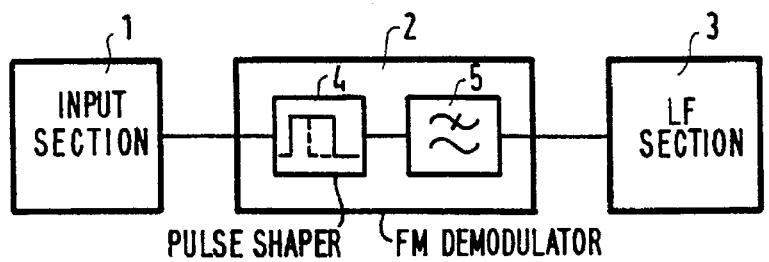
FIG. 1 shows a receiver in accordance with the inventions.

FIG. 1 shows a receiver in accordance with the invention. The receiver comprises, in this order, an input section 1, an FM demodulator 2, and an LF section 3, which serves for further signal processing. The FM demodulator 2 receives a frequency-modulated input signal. The FM demodulator 2 is of the pulse count type and for this purpose it comprises, in this order, a pulse shaper 4 and a low-pass filter 5. The pulse shaper 4 generates a pulse of accurately defined shape upon a rising and/or falling edge of the input signal of the FM demodulator. The spacing between two successive pulses is dictated by the instantaneous frequency of the frequency-modulated input signal. The modulation signal is obtained by integrating the pulses in a low-pass filter 5. The uniformity of the pulses, i.e., the accuracy with which the pulses are formed, defines the linearity of the FM demodulator.

This means that the pulse duration should be as constant as possible.

Figure 2:
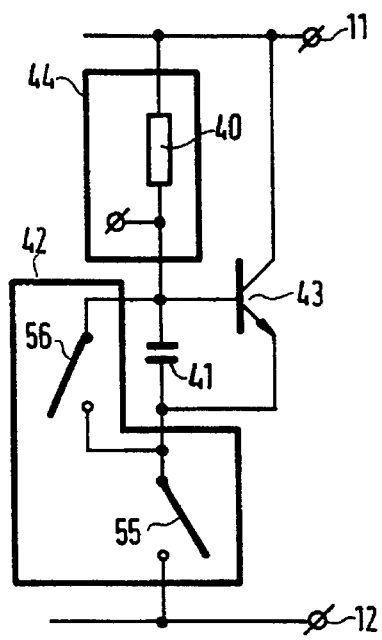
FIG. 2 shows a pulse shaper for use in a receiver in accordance with the inventions.

FIG. 2 shows diagrammatically a pulse shaper for use in a receiver in accordance with the invention. The pulse shaper comprises a series arrangement of a load 40 and a capacitance 41, coupled to a supply terminal 11. The pulse shaper further comprises a switching device 42 formed by switches 55 and 56. The switch 55 is arranged between the capacitance 41 and the supply terminal 12, and the switch 56 is arranged across the capacitance 41. The base-emitter junction of the transistor 43 is also connected across the capacitance 4 I. In the present case, the load 40 also constitutes the output means 44 across which the pulse is available as a voltage.

Figure 3:
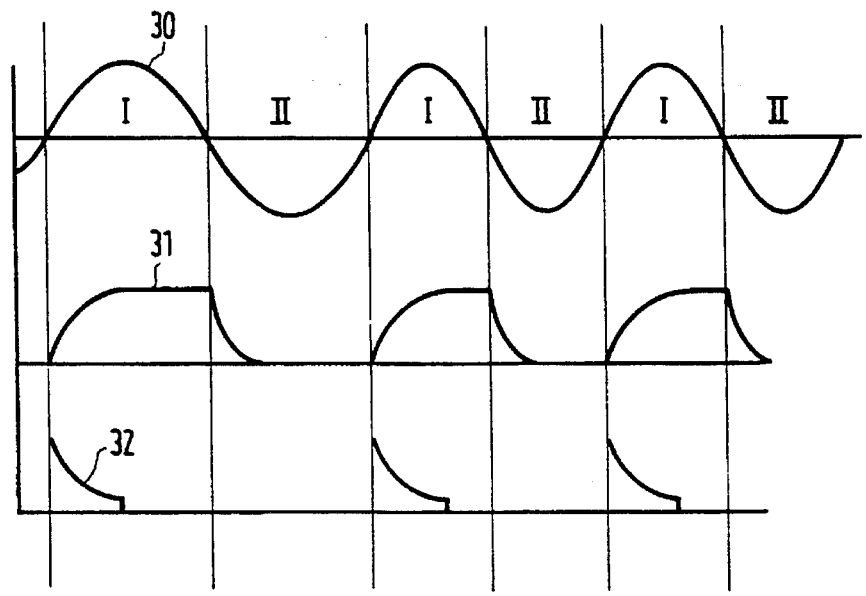
FIG. 3 shows signals appearing in the pulse shaper.

The operation of the pulse shaper shown in FIG. 2 will now be explained with reference to the waveform diagram in FIG. 3. This Figure shows, as a function of time, the voltage 30 representing the frequency-modulated input signal, the voltage 31 across the capacitance 41, and the voltage 32 across the resistor 40. In a time interval I, the switching device is in a first state, and in a time interval II, the switching device is in a second state. In the first state I, the switch 55 is closed and the switch 56 is open. The capacitance, is now charged until the base-emitter junction of the transistor 43 becomes conductive. The charging current of the capacitance 41, which flows via the resistor 40, will now be interrupted and the current will be taken over by the transistor 43. The voltage across the capacitance, is limited to the value of the voltage of a conductive base-emitter junction, which voltage value will be referred to hereinafter as Vbe. In the second state II, the switch 55 opens and the switch 56 closes, so that the capacitance 41 is discharged. The second state II is followed by a first state I, so that the charging and the discharging cycles are repeated. On each rising edge of the input signal 30 a pulse is generated across the resistor 40, which pulse has an accurately defined duration dictated by the charging characteristic of a capacitance which is charged from a voltage source (the supply voltage) via a resistor. The duration of the pulse is determined by the instant at which the transistor 43 is turned on and further depends on the value of the supply voltage, the magnitude of the resistor 40 and the magnitude of the capacitance 41. Since these values and magnitudes are not variable the instant at which the transistor 41 is turned on will not vary and will therefore be accurately defined. This yields a pulse whose duration is measured and limited by only one element: the transistor 43. Owing to the small number of components and the single measurement transistor 43, this pulse is generated with minimal noise. The time interval, in which the capacitance 41 is charged until the transistor 43 limits the voltage, should be shorter than the time interval between two successive edges of the input signal because otherwise, the pulse duration will no longer be independent of the input signal but will be limited by the instant of changing over from the second state to the first state. The discharging time should also be shorter than the time interval between two successive edges of the input signal in order to prevent the discharging time from being influenced by a residual voltage across the capacitance 41. This residual voltage occurs because, in practice, the switch 56 will have an ohmic resistance, as a result of which the capacitance will not be discharged to the full extent. For effectively minimizing the residual voltage, the discharging time, which is determined by inter alia the resistance of the switch 56, should be sufficiently small.

Thus, one pulse is generated for each period of the input signal. The time between two successive pulses is inversely proportional to the instantaneous frequency of the input signal 30. Integration of the pulses in the low-pass filter 5 following the pulse shaper 4 will yield a voltage which is proportional to the instantaneous frequency.

It is possible for the switch 55 in FIG. 2 to remain permanently closed. As a result, the series arrangement of the load 40 and the capacitance 41 is disposed directly between the supply terminals 11 and 12. The output means may now be constituted, for example, by a logic AND gate having a first input to which a voltage proportional to the current through the collector of the transistor 43 is applied and a second input to which the voltage 30 is applied.

Figure 6:
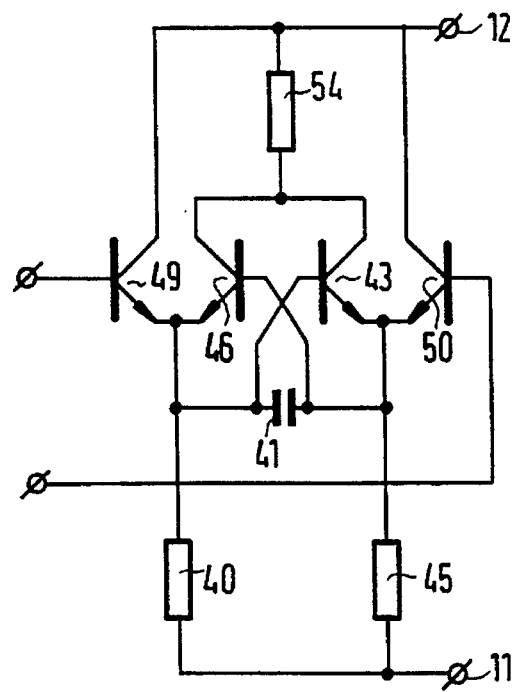
FIG. 6 shows an alternative symmetrical version of the pulse shaper.

Another version of the pulse shaper can be realized by reversing the polarity of the supply voltage and the orientation of the base-emitter junction of the transistor 43 in FIG. 2. The collector of the transistor 43 should now be coupled to the supply terminal 12 of the power supply. The output means 44 may again comprise an AND gate as described above. A symmetrical version of such a pulse shaper is shown in FIG. 6.

Figure 4:
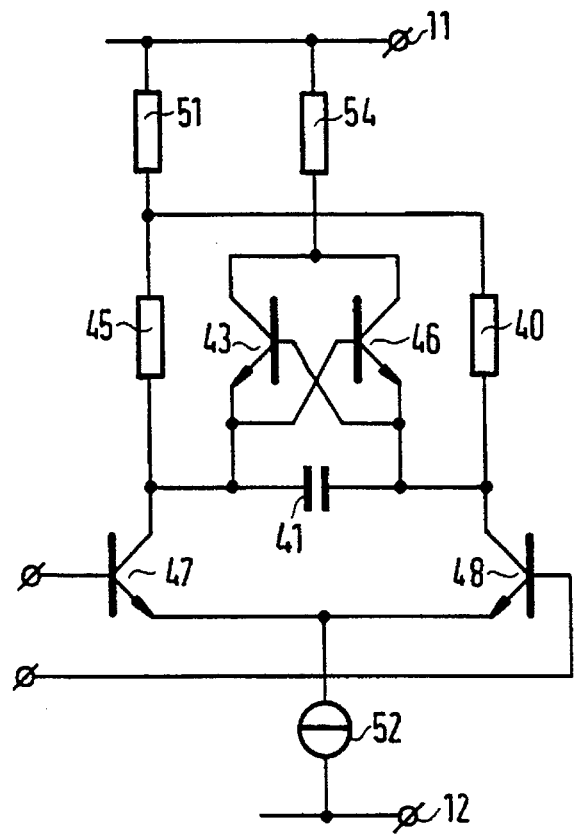
FIG. 4 shows a symmetrical version of the pulse shaper.

FIG. 4 shows a symmetrical version of the pulse shaper for use in a receiver in accordance with the invention, comprising a pulse count FM demodulator. The pulse shaper comprises a capacitance 41 across which the base-emitter paths of the transistors 43 and 46, which are arranged in anti-parallel, are connected. The collectors of the transistors 43, 46 are commoner at the supply terminal 11 via a first output resistor 54. The capacitance 41 is arranged between the collectors of emitter-coupled transistors 47 and 48, which have a current source 52 coupled to the common emitter line. A second output resistor 51 couples the collectors of the transistors 47, 48 to the supply terminal 11 via respective load resistors 45, 40. A symmetrical frequency-modulated input signal for the FM demodulator is applied to the bases of the transistors 47 and 48.

The present pulse shaper operates as follows. In a first state I, the transistor 47 conducts and the transistor 48 does not conduct owing to a rising edge of the input signal. As a result, the current source 52 is connected to the resistor 45. A current through the resistor 45 requires a voltage drop across this resistor. Since the capacitance 41 and the resistor 45 are disposed in parallel with the resistor 45, this voltage drop will be opposed by the voltage across the capacitance 41, which has been charged oppositely in the previous state. As a result, the current will flow primarily through the capacitance 41 (and consequently through the resistor 40) at the beginning of the first state. As the voltage across the capacitance increases, the current through the resistor 45 will also be able to increase and the current will be token over gradually by the resistor 45. Charging continues until the base-emitter junction of the transistor 43 is turned on, causing the current to flow via the collector-emitter path of the transistor 43, the voltage across the capacitance 41 being limited to an accurately defined value by the base-emitter junction of the transistor 43. This situation continues until the circuit is set to a second state II in response to a falling edge of the input signal. As a result, the transistor 47 is turned off and the transistor 48 is turned on. The capacitance 41 is now discharged or charged oppositely in a manner similar to that in the first state, until the base-emitter junction of the transistor 46 becomes conductive. As a result, discharging of the capacitance 41 is discontinued and the current is taken over by the transistor 46. Both in the first state, and in the second state charging/discharging of the capacitance 41 proceeds until the voltage across the capacitance 41 has become so high that a base-emitter junction becomes conductive. The charging time is thus determined by the capacitance value, the value of the current of the current source 52, the resistance values of the resistors 40 and 45, and the voltage value Vbe at which a base-emitter junction becomes conductive. Thus, the pulse duration is defined accurately and with minimal noise because the end of the discharging time is determined by only one transistor connected directly across the capacitance. The current through the capacitance 41 is pulse shaped, its pulse width and height being known precisely. A signal corresponding to the current through the capacitance is available across the resistor 51 and—in inverted form—across the resistor 54. The resistor 54, the resistor 51, or both resistors may now be regarded as the output means 44 which generate a voltage varying with the current through the capacitance 41. Since both the charging and the discharging current of the capacitance 41 flow through the resistor 51, two pulses of constant width and height will appear across the resistor 51, during one full period of the input signal. Two pulses per period will also appear across the resistor 54. The output signal may also be taken from the loads 40 and/or 45, although only one pulse per period appears across these loads because only the charging current or the discharging current flows through the resistor and the resistor 45, respectively. Depending on the location where the output signal is to be read out, the resistor 51 and/or the resistor 54 may be dispensed with, if desired.

Figure 5:
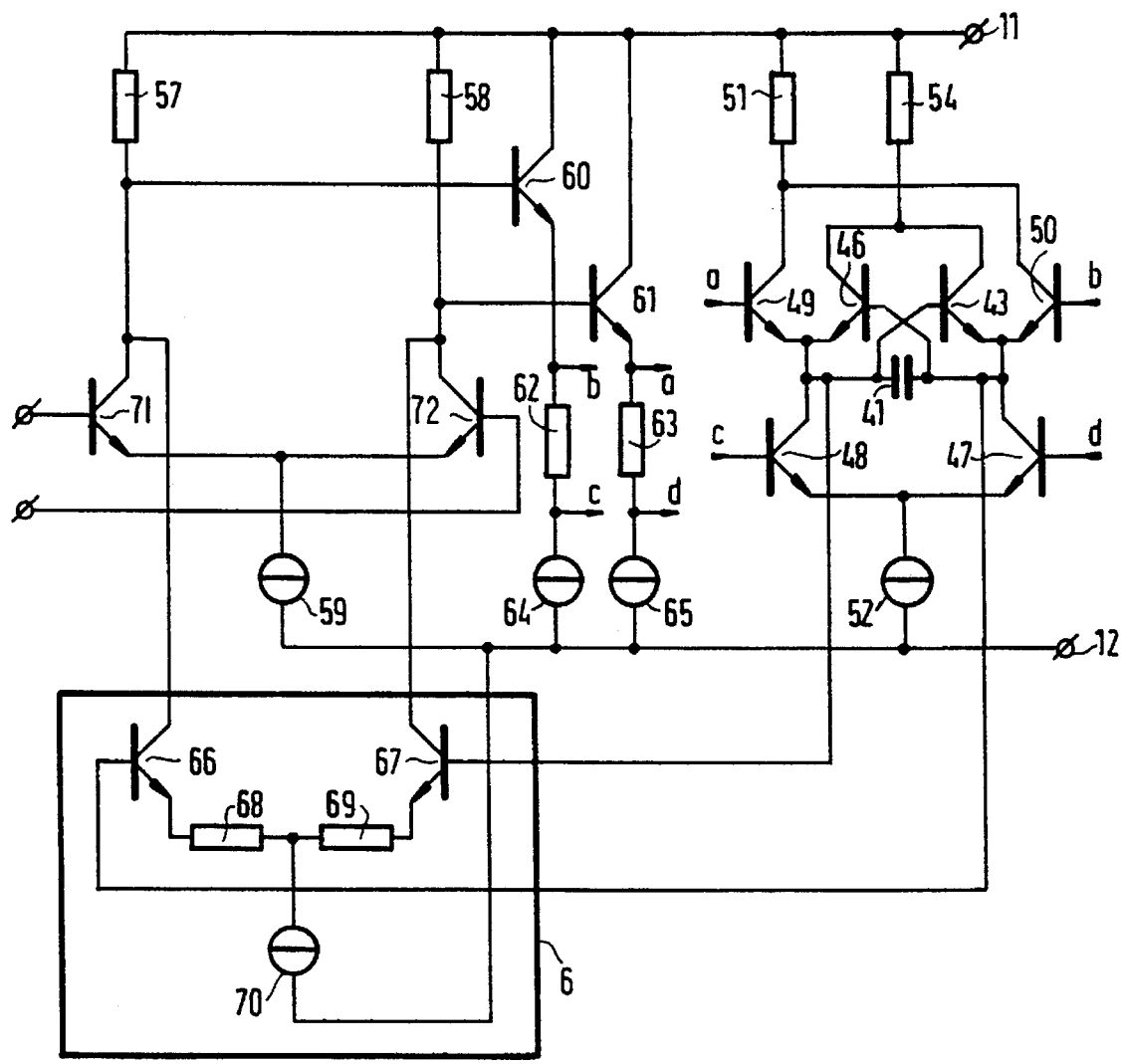
FIG. 5 shows a symmetrical low-noise version of the pulse shaper.

FIG. 5 shows a symmetrical low-noise version of the pulse shaper. FIG. 5 shows that the same elements as in FIG. 4 are used for the pulse shaper. The resistors 40 and 45 have been replaced by transistors 49 and 50. These transistors are controlled in such a manner that in a first state of the circuit, the transistors 47 and 49 conduct and the transistors 48 and 50 do not conduct, and in a second state of the circuit, the transistors 47 and 49 conduct and the transistors 48 and 50 do not conduct. This has the advantage that in each state only a single resistor 51 is coupled to the capacitance 41, in contrast with at least two loads/resistors 40, 45 in FIG. 4. As a result, the noise caused by the resistors in FIG. 5 is lower than the noise in FIG. 4. The addition of the transistors 49 and 50 also results in the current through the capacitance being switched over, and the current not being divided between two resistors. As a consequence, the charging and discharging time is now determined exclusively by the capacitance value of the capacitance 41, by the value of the current of the current source 52 and by the voltage value Vbe at which the base-emitter junction of the transistor 43 or 46 becomes conductive.

The pulse shaper is driven by the circuit comprising the transistors 71, 72, 60, 61, the resistors 57, 58, 62, 63 and the current sources 59, 64, 65. The emitter-coupled transistors 71 and 72 form a differential pair having a current source 59 coupled to their common emitter line. The collectors of the transistors 71 and 72 are coupled to the supply terminal 11 via respective resistors 57 and 58. The transistors 60 and 61, which have their emitters coupled to respective current sources 64 and 65 via a resistor 62 and 63, respectively, now form emitter followers coupled to the collectors of the transistor 71 and 72, respectively. In the present case, the resistors 62 and 63 function as level shifters. The pulse shaper is driven by connecting the emitters of the transistors 61 and 62 to the bases of the transistors 49 and 50, respectively, and by connecting the current sources 65 and 64 to the bases of the transistors 47 and 48, respectively. This configuration provides a high degree of uniformity as regards the switching instants of the transistors 47 to 50.

Since the terminals of the capacitance 41 are voltage-driven via the transistors 49 and 50, a common-mode voltage transient will appear across the capacitance 41 during the change-over from the first state to the second state, and vice versa. For example, in the first state, the transistor 49 will conduct and the emitter of the transistor 49 will be at a fixed voltage. Eventually, at the end of the first state, the emitter of the transistor 50 will be at a voltage equal to the emitter voltage of the transistor 49 minus one Vbe. During the transition from the first to the second state the transistor 49 is now turned off and the transistor 50 is turned on, so that the emitter voltage of the transistor 50 is raised by the switching voltage on the base of the transistor 50, which switching voltage is equal to the base voltage of the transistor 49 during the first state. As a result, a voltage rise equal to one Vbe will appear at the terminals of the capacitance 41. Particularly in an integrated circuit, these voltage transients will be transferred to other circuits in the same semiconductor material via parasitic capacitances, which may adversely affect these circuits. Therefore, a voltage-transient compensation circuit 6 has been provided, which substantially eliminates these voltage transients. The voltage-transient compensation circuit 6 imposes a voltage difference between the base of the transistor 49 immediately before and the base of the transistor 50 immediately after the transition from the first state to the second state and between the base of the transistor 49 immediately after and the base of the transistor 50 immediately before the transition from the second state to the first state. For an effective compensation, this voltage difference should be equal to the instantaneous capacitance voltage, which is equal to one Vbe. For this purpose, the version shown in FIG. 5 comprises an additional differential pair formed by the transistors 66 and 67, whose emitters are jointly coupled to the current source 70 via respective emitter degeneration resistors 68 and 69. The collectors of the transistors 66 and 67 are coupled to the collectors of the transistors 71 and 72, respectively, and the bases of the transistors 66 and 67 are coupled to the collectors of the transistors 47 and 48, respectively. The gain of the differential pair comprising the transistors 66 and 67 is now unity by giving the resistors 68 and 69 substantially the same values as the resistors 57 and 58. At the instant of switching over from the first to the second state, this results in a voltage difference equal to half the capacitance voltage being added to the base voltage of the transistor 60 and being subtracted from the base voltage of the transistor 61, which provides compensation for the voltage transient across the capacitance 41. When changing over from the second state to the first state, the same happens as described above, the only difference being that the sign of the capacitance voltage is reversed.

FIG. 6 shows an alternative version of a symmetrical pulse shaper. This version comprises a capacitance 41, across which the base-emitter paths of the transistor 43 and 46, which are arranged in anti-parallel, are connected. The collectors of the transistors 43, 46 are jointly coupled to the supply terminal 12 via a first output resistor 54. The capacitance 41 is arranged between the emitters of the transistors 49 and 50, whose collectors are connected to the supply terminal 12. The symmetrical frequency-modulated input signal for the FM demodulator is applied to the bases of the transistors 47 and 48. In FIG. 6, the polarity of the supply terminals 11 and 12 has been reversed in comparison with the situation in FIG. 4.

In the first state I, the transistor 49 will conduct and the transistor 50 will not conduct. As a result of this, the capacitance 41 is charged via the transistor 49 and the load 45 until the voltage across the capacitance has become so high that the transistor 53 is turned on. The current through the capacitance 41 is now taken over by the transistor 43. In the second state, the transistor 50 will conduct and the transistor 49 will not conduct, the capacitance 41 being charged oppositely until the transistor 46 is turned on and takes over the current through the capacitance 41. In both states, a voltage is produced across the resistor 54, which voltage forms the complement of the current through the capacitance; if the capacitance 41 is charged, no current will flow through the resistor 54 and if the capacitance 41 has been charged and the voltage across the capacitance 41 is limited a current will flow through the resistor 54. The resistor 54 forms the output means 44. Since the pulse shaper is driven at the bases of the transistors 49 and 50, there will also be voltage transients in the present circuit, which transients can be compensated for by means of a voltage transient compensation circuit 6 as shown in FIG. 5.

To those skilled in the art, it will be obvious that variants which basically correspond to the invention are possible. For example, there are different possibilities of driving the bridge arrangement in FIG. 5. The loads 40 and 45 in FIG. 6 may also be constituted by current sources. Moreover, it is possible to implement the circuits in MOS technology, in which case the base, emitter and collector should be replaced by the gate, source and drain of the MOS transistor. The circuits can also be constructed by means of transistors of opposite conductivity types. Besides, if desired, one or more diodes may be arranged in series with the base-emitter path of the transistor 43 and/or 46 without departing from the scope of the invention. In addition, the frequency-modulated input signal may be limited in amplitude, although this is not essential for the invention.

We claim:

1. A receiver comprising, arranged in this order, an input section, an FM demodulator, to which a frequency-modulated input signal is applied, and an LF section, said FM demodulator comprising a pulse shaper and a low-pass filter, characterized in that the pulse shaper comprises:

a series arrangement of at least a load and a capacitance, said load being coupled to a first supply terminal;

a switching device which charges said capacitance in a first state, initiated by a first edge of the frequency-modulated input signal, and which discharges said capacitance in a second state, initiated by a second edge following the first edge;

a first transistor having a base-emitter junction arranged across said capacitance, and having a collector coupled to the first supply terminal for limiting a voltage across said capacitance; and output means for generating an output signal which varies with a current through said capacitance, wherein a charging time and a discharging time of said capacitance are smaller than a minimum time between two successive edges of the frequency-modulated input signal.

2. A receiver as claimed in claim 1, characterized in that said capacitance has a first terminal and a second terminal coupled to the first supply terminal via the first load and a second load, respectively;

said pulse shaper further comprises a second transistor having a base-emitter junction arranged across said capacitance in a direction opposite to a direction of the base-emitter junction of the first transistor;

a collector of the first transistor and the collector of the second transistor being jointly coupled to the first supply terminal;

the switching device connecting the first terminal of said capacitance to a second supply terminal in the first state, and the second terminal of said capacitance to the second supply terminal in the second state, respectively; and the output means generating an output signal which varies with a current through at least one of the first transistor, the second transistor, the first load and the second load.

3. A receiver as claimed in claim 2, wherein said frequency-modulated input signal is a frequency-modulated symmetrical input signal, characterized in that the switching device comprises a first differential amplifier having a third and a fourth transistor, said third and fourth transistors having emitters coupled together forming a common emitter line, the common emitter line being coupled to the second supply terminal, a collector of the third transistor and a collector of the fourth transistor being coupled to, respectively, the second terminal and the first terminal of said capacitance, inputs of said third and fourth transistors being coupled to receive the frequency-modulated symmetrical input signal.

4. A receiver as claimed in claim 3, characterized in that the first load and the second load comprise collector-emitter paths of a fifth transistor and a sixth transistor, respectively, said fifth and sixth transistors having collectors coupled to the first supply terminal via a first resistor.

5. A receiver as claimed in claim 2, characterized in that a current source is arranged in a connection of the switching device with the second supply terminal.

6. A receiver as claimed in claim 1, characterized in that:

the capacitance has a first terminal and a second terminal coupled to the first supply terminal via the first load and a second load, respectively;

said pulse shaper further comprising a second transistor having a base-emitter junction arranged across the capacitance in a direction opposite to a direction of the base-emitter junction of the first transistor;

a collector of said second transistor and the collector of the first transistor being jointly coupled to a second supply terminal;

the switching device coupling the first terminal of the capacitance to the second supply terminal in the first state, and the second terminal of the capacitance to the second supply terminal in the second state, respectively; and the output means generating a signal which varies with a current through at least one of the first and second transistors.

7. A receiver as claimed in claim 6, characterized in that the switching device comprises a fifth transistor and a sixth transistor, said fifth and sixth transistors having collectors coupled to the second supply terminal, an emitter of the fifth being coupled to the first terminal of the capacitance, and an emitter of the sixth transistor being coupled to the second terminal of the capacitance.

8. A receiver as claimed in claim 4, characterized in that the pulse shaper comprises a voltage-transient compensation circuit having an output voltage which is added to switching voltages on bases of fifth and sixth transistors, wherein a first voltage difference is imposed between the base of the fifth transistor immediately before a transition from the first state to the second state, and the first voltage difference is imposed between the base of the sixth transistor immediately after the transition from the first state to the second state;

a second voltage difference is imposed between the base of the fifth transistor immediately after a transition from the second state to the first state, and the second voltage difference is imposed between the base of the sixth transistor immediately before the transition from the second state to the first state, the first and the second voltage differences substantially corresponding to a capacitance voltage appearing during a first and a second switching operation.

9. An FM demodulator comprising a pulse shaper, characterized in that said pulse shaper is implemented as an integrated circuit in a semiconductor material and comprises:

a series arrangement of at least a load and a capacitance, said load being coupled to a first supply terminal;

a switching device for charging the capacitance in a first state, initiated by a first edge of the frequency-modulated input signal, and for discharging the capacitance in a second state, initiated by a second edge following the first edge;

a first transistor having a base-emitter junction arranged across the capacitance, and having a collector coupled to the first supply terminal or to a second supply terminal for limiting a voltage across said capacitance; and output means for supplying an output signal to an output terminal intended to have a low-pass filter coupled thereto, said output signal varying with a current through the capacitance, a charging time and a discharging time of the capacitance being smaller than a minimum time between two successive edges of the frequency-modulated input signal.

10. A receiver comprising, arranged in this order, an input section, an FM demodulator, to which a frequency-modulated input signal is applied, and an LF section, said FM demodulator comprising a pulse shaper and a low-pass filter, characterized in that the pulse shaper comprises:

a series arrangement of at least a load and a capacitance, said load being coupled to a first supply terminal;

a switching device which charges said capacitance in a first state, initiated by a first edge of the frequency-modulated input signal, and which discharges said capacitance in a second state, initiated by a second edge following the first edge;

a first transistor having a base-emitter junction arranged across said capacitance, and having a collector coupled to a second supply terminal for limiting a voltage across said capacitance; and output means for generating an output signal which varies with a current through said capacitance, wherein a charging time and a discharging time of said capacitance are smaller than a minimum time between two successive edges of the frequency-modulated input signal.

* * * * *